United States Patent
Berrian et al.

(10) Patent No.: US 7,547,898 B2
(45) Date of Patent: *Jun. 16, 2009

(54) PARTICULATE PREVENTION IN ION IMPLANTATION

(75) Inventors: Donald W. Berrian, Topsfield, MA (US); John W. Vanderpot, Boxford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 456 days.

This patent is subject to a terminal disclaimer.

(21) Appl. No.: 11/445,667

(22) Filed: Jun. 2, 2006

(65) Prior Publication Data

US 2006/0284116 A1 Dec. 21, 2006

Related U.S. Application Data

(60) Provisional application No. 60/687,514, filed on Jun. 3, 2005.

(51) Int. Cl.
*G21K 5/10* (2006.01)
*H01J 37/08* (2006.01)

(52) U.S. Cl. ............... 250/492.21; 250/396 R; 250/398; 250/492.2; 250/423 R; 250/397; 250/400; 250/492.3; 250/251; 250/492.22; 250/396 ML; 427/523; 204/298.04; 200/252

(58) Field of Classification Search ............ 250/492.21, 250/396 R, 398, 492.2, 423 R, 397, 400, 250/492.3, 251, 492.22, 396 ML; 427/523; 204/298.04; 200/252

See application file for complete search history.

(56) References Cited

U.S. PATENT DOCUMENTS 5,134,299 A    7/1992   Denholm
6,501,078 B1  12/2002   Ryding et al.

(Continued)

FOREIGN PATENT DOCUMENTS

EP    1030344 A2    8/2000

(Continued)

OTHER PUBLICATIONS

U.S. Appl. No. 11/445,677, filed Jun. 2, 2006, Vanderpot et al.

(Continued)

*Primary Examiner*—Jack I Berman
*Assistant Examiner*—Meenakshi S Sahu
(74) *Attorney, Agent, or Firm*—Eschweiler & Associates, L.L.C.

(57) ABSTRACT

A system and method for mitigating contamination in an ion implantation system is provided. The system comprises an ion source, a power supply operable to supply power to a filament and mirror electrode of the ion source, a workpiece handling system, and a controller, wherein the ion source is selectively tunable via the controller to provide rapid control of a formation of an ion beam. The controller is operable to selectively rapidly control power to the ion source, therein modulating a power of the ion beam between an implantation power and a minimal power in less than approximately 20 microseconds based, at least in part, to a signal associated with a workpiece position. Control of the ion source therefore mitigates particle contamination in the ion implantation system by minimizing an amount of time at which the ion beam is at the implantation current.

22 Claims, 4 Drawing Sheets

U.S. PATENT DOCUMENTS

| | | |
|---|---|---|
| 6,661,016 B2 | 12/2003 | Berrian |
| 2002/0053642 A1 | 5/2002 | Berrian |
| 2006/0284117 A1* | 12/2006 | Vanderpot et al. ...... 250/492.21 |

FOREIGN PATENT DOCUMENTS

| | | | |
|---|---|---|---|
| GB | 2345574 A | 7/2000 | |

OTHER PUBLICATIONS

U.S. Appl. No. 11/445,722, filed Jun. 2, 2006, Vanderpot et al.

International Search Report for International Patent Application PCT/US06/021647; Mailing Date of Mar. 9, 2007, p. 1-6.

* cited by examiner

PARTICULATE PREVENTION IN ION IMPLANTATION

REFERENCE TO RELATED APPLICATION

This application claims priority to and the benefit of U.S. Provisional Application Ser. No. 60/687,514 which was filed Jun. 3, 2005, entitled PARTICULATE PREVENTION IN ION IMPLANTATION, the entirety of which is hereby incorporated by reference as if fully set forth herein.

FIELD OF THE INVENTION

The present invention relates generally to an ion implantation system and method for implanting ions into a workpiece, and more specifically to a system and method for mitigating particulate contamination within an ion beam at various positions upstream of the workpiece.

BACKGROUND OF THE INVENTION

In the manufacture of semiconductor devices, ion implantation systems are employed to dope a semiconductor wafer or other workpiece with impurities. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beam-line assembly including a mass analysis apparatus for mass resolving the ion beam using magnetic fields, and a target chamber containing the semiconductor wafer or workpiece to be implanted by the ion beam.

Typically, the ions generated from the ion source are formed into a beam and directed along a predetermined beam path to an implantation station. The ion beam implanter may further include beam forming and shaping structures extending between the ion source and the implantation station. The beam forming and shaping structures maintain the ion beam and bound an elongated interior cavity or passageway through which the beam passes en route to the implantation station. When operating the ion implanter, this passageway is typically evacuated to reduce the probability of ions being deflected from the predetermined beam path as a result of collisions with air molecules.

The mass of an ion relative to the charge thereon (i.e., charge-to-mass ratio) affects the degree to which it is accelerated both axially and transversely by an electrostatic or magnetic field. Therefore, the beam that reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

The ion beam is focused and directed at a desired surface region of the workpiece. Typically, the energetic ions of the ion beam are accelerated to a predetermined energy level to penetrate into the bulk of the workpiece. The ions, for example, are embedded into the crystalline lattice of the material to form a region of desired conductivity, with the energy of the ion beam generally determining the depth of implantation. Examples of ion implantation systems include those available from Axcelis Technologies of Beverly, Mass.

Operation of a typical ion implanter or other ion beam equipment (e.g., a linear accelerator), however, may result in the production of contaminant particles. The contaminant particles, for example, may be less than about 1 μm in size. The momentum of the ions in the beam that strike the particles, in turn, cause the particles to be transported with the beam, although typically at a speed much less than the ions. Consequently, particles entrained in an ion beam may be transported with the beam toward the workpiece, thus resulting in undesired contamination at the wafer.

Therefore, it is desirable to increase the utilization rate of the ion beam, therein increasing efficiency of the system, as well as mitigating potential workpiece contamination.

SUMMARY OF THE INVENTION

The present invention overcomes the limitations of the prior art by providing a system and method for reducing contamination of a workpiece. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a system and method for mitigating particulate contamination of a workpiece in an ion implantation system, wherein a control is provided for rapidly modulating an output of an ion source. The invention provides for more efficient duty cycles of the ion implantation system, while reducing contamination associated with conventional ion implantation systems. Rapid control of the ion source is provided by electrically controlling electron flux within an ion source chamber, rather than by relying on thermal control of the ion chamber filament or changes in arc voltage.

According to one exemplary aspect of the invention, a method for controlling particulate contamination is provided, wherein the ion source rapidly modulates the intensity of an ion beam between an implantation current and a minimal current, based, at least in part, on a control signal. The control signal, for example, indicates a presence or absence of a workpiece within the ion implantation system. For example, a position of the workpiece within the ion implantation system is determined, wherein the current or intensity of the ion beam is modulated either from the implantation current to the minimal current, or vice versa, depending on the position of the workpiece. An ion source is further provided, wherein the ion source comprises an ion chamber, a filament-cathode operable to emit electrons for the ionization of the precursor gas for the generation of the ion beam, and a mirror electrode having a potential associated therewith and located on the other side of said ion chamber. The mirror electrode, for example, is operable to vary its potential relative to the filament, wherein the number of the electrons available in the ion chamber for ionization is variable. Accordingly, the ion beam can be rapidly modulated based on the control signal.

According to another aspect of the present invention, the ion source comprises an ion chamber, a filament-cathode, a mirror electrode, and a grid operable to vary the grid's potential relative to the filament. Accordingly, the grid is operable to control the number of the electrons available in the ion chamber for ionization. In accordance with another exemplary aspect of the invention, the current of the ion beam can be modulated between the minimal current and the implantation current in less than 20 microseconds, wherein the ion beam power is operable to be cleanly and efficiently ramped up or down in a selectable manner, thus mitigating contamination associated with maintaining the ion beam current at the implantation power during workpiece transfers, as well as mitigating the deleterious effects of relying on thermal control of the ion chamber filament or changes in arc voltage to modulate intensity of the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
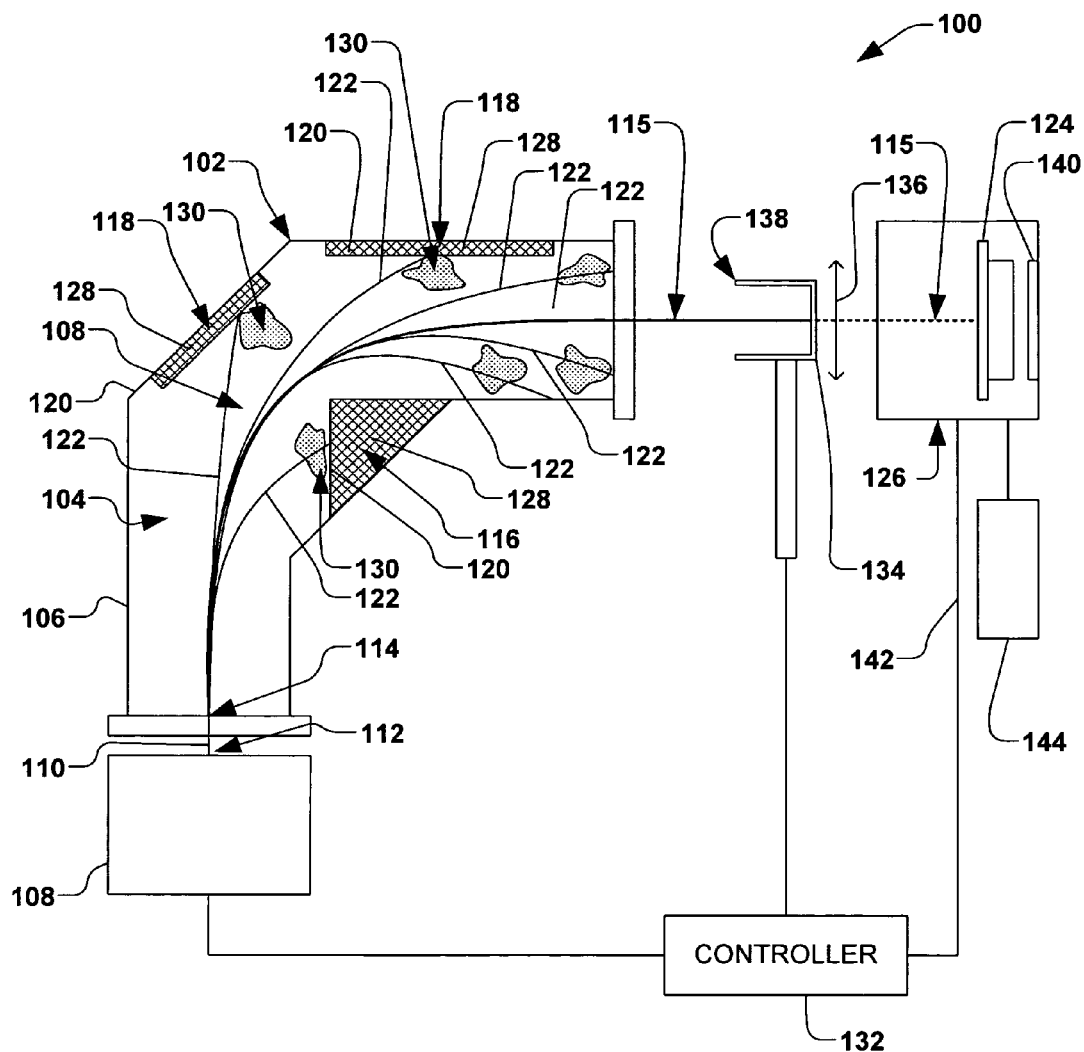
FIG. 1 is a plan view of an exemplary ion implantation system according to one aspect of the present invention.

The present invention is directed generally towards systems, apparatuses, and methods for generally preventing particulate contamination of a workpiece being subjected to an ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Typically, ion implantation systems run continuously; that is, an ion beam is formed within the ion implantation system, regardless of whether a workpiece is in place for implantation. For example, after a workpiece has been implanted with ions, the ion beam is typically blocked by a Faraday cup upstream of the workpiece, wherein the workpiece is exchanged while the ion beam impacts the Faraday cup. The inventors, however, presently appreciate that even though the workpiece is generally blocked from effects of the ion beam during the exchange, the remainder of the ion implantation system upstream of the Faraday cup is still generally exposed to the ion beam (at the same or similar power as used for implantation). Therefore, contaminant particles continue to be formed and/or entrained in the ion beam upstream of the Faraday cup, even though a workpiece may not be in the process of being implanted with ions.

Within a mass analyzer of an ion implantation system, for example, the passageway thereof is typically coated with graphite, wherein ions of undesirable molecular weight generally impact the graphite lining the passageway and become entrained in the graphite coating. Over time, however, as ions continue to strike the graphite coating, particles of the graphite coating may be dislodged from the passageway and may then become entrained in the ion beam. Subsequently, these contaminant particles within the ion beam can collide with and adhere to other components, and may eventually travel to the workpiece or other substrate during ion implantation, thus becoming a source of yield loss in the fabrication of semiconductor and other devices that require submicroscopic pattern definition on the treated workpieces.

Conventional ion implantation systems typically energize and tune an ion source providing the ions at the beginning of a production run (e.g., at the beginning of a work day), wherein the ion source continuously forms the ion beam at full power throughout the production run, regardless of whether or not a workpiece is being implanted with ions. Such a continuous full-power production of the ion beam, however, has several disadvantages that are presently appreciated by the inventors. For example, typical ion implantation systems have approximately a 50% utilization rate of the ion beam, wherein workpieces are implanted with ions approximately half of the time that the full-power ion beam is present within the ion implantation system. Thus, energy and materials used to power the ion source are generally wasted during the remaining time, such as during transition periods when workpieces are transferred into or out of implantation system.

The inventors of the present invention further contemplate that with a continuous operation of the ion beam at full power, contaminants build up within the system continuously, regardless of whether or not a workpiece is being implanted with ions, thus leading to more frequent maintenance of the system.

Conventionally, such build-up of contaminants has been considered negligible and/or unavoidable, wherein continuously operating the ion beam at full power was believed to be an integral part of the ion implantation process. The inventors of the presently-claimed invention, however, appreciate that such build-up of contaminants is not negligible, and that subsequent contamination of the workpiece can be mitigated by providing an intermittent duty cycle for the ion source, as will now be described in greater detail.

Referring now to the figures, in accordance with one exemplary aspect of the present invention, FIG. 1 illustrates a simplified plan view of an exemplary ion implantation system 100. It should be noted that the ion implantation system 100 of FIG. 1 is illustrated to provide an upper-level understanding of the invention, and is not necessarily drawn to scale. Accordingly, various components may or may not be illustrated for clarity purposes. It shall be understood that the various features illustrated can be of various shapes and sizes, or excluded altogether, and that all such shapes, sizes, and exclusions are contemplated as falling within the scope of the present invention.

According to one exemplary aspect of the present invention, the ion implantation system 100 comprises a vacuum chamber 102 situated within a main magnetic field 104 of a mass analyzer 106 (also called a "magnet"). An ion source 108 is operable to form an ion beam 110, wherein the ion beam exits the ion source at an exit aperture 112 thereof, and wherein the ion beam enters the mass analyzer 106 through an entrance 114 of the mass analyzer. The mass analyzer 106 is operable to separate the ion beam 110 based, at least in part, on the molecular weight of elements comprising the ion beam, as will be understood by one of ordinary skill in the art. Accordingly, the mass analyzer 106 is operable to extract a selected ray or beam 115 of a selected element (e.g., boron) from the ion beam 110, wherein lighter elements (e.g., hydrogen) that are lighter in molecular weight than the selected element tend to turn toward a first region 116, while heavier elements that are heavier in molecular weight than the selected element tend to turn toward a second region 118. Typically, the lightest elements that impact the first region 116 do not cause significant damage upon striking a wall 120 of the chamber 102, however, the heaver elements that strike the walls 120 of the chamber in the second region 118 tend to cause more damage due, at least in part, to their higher mass.

Elements that are not of the selected molecular weight (i.e., not in the selected beam 115) are called waste beams 122, since they are beams that are comprised of undesired material, and are not intentionally implanted into a workpiece 124 positioned in an end station 126. Conventionally, the walls 120 of the chamber 102 are lined with graphite 128, wherein upon the waste beams 122 striking the walls, the elements comprising the waste beams become entrained in the graphite. However, depending on the angle at which they strike the graphite 128 of the walls 120, the elements may fail to bury themselves, and may further sputter some of the graphite away. Furthermore, in many cases, the ion beam 110 comprises highly reactive materials, such as fluorine, wherein the highly reactive elements further remove material from the walls 120 and cause clouds 130 of chemically active particles to become lofted inside the vacuum chamber 102. Over time, the clouds 130 of contamination build up, thus causing flakes (not shown) of material to form and thicken on the walls 120 and other interior components, wherein the flakes eventually spall off the walls and components, thereby leading to potential contamination on the workpiece 124.

The present invention advantageously minimizes such contamination by providing an intermittent duty cycle for the ion source 108, wherein the ion beam 110 is operable to be substantially "blanked" or dimmed from the implantation power (e.g., the intensity of the ion beam during ion implantation into the workpiece 124) to a "minimal power" (e.g., between 0% and 10% of the implantation power), wherein deleterious contamination effects from the ion beam are minimized at various times throughout the production run, such as during an exchange of workpieces 124 into and out of the end station 126. Accordingly, since the ion beam is substantially dimmed when ions are not being implanted into the workpiece 124, proportionally less particulate material will be generated throughout the ion implantation system 100.

Therefore, in accordance with the present invention, a controller 132 (e.g., a control system) is provided, wherein the controller is operable to modulate the power of the ion beam 110 between the implantation power and the minimal power based on one or more inputs. For example, the controller 132 is operable to control the ion beam power between a high power to a substantially low power, wherein the control can be triggered by various inputs, such as the presence or absence of the workpiece 124 in the end station 126, by operator input, or by various other inputs. In one alternative, the power can be further modulated as taught by Berrien in U.S. Pat. No. 6,661,016, the contents of which are incorporated by reference herein.

As will be described infra, the ion beam 110 of the present invention can be almost instantaneously modulated between the implantation power and the minimal power at any time via controlling the ion source 108 without many of the deleterious effects seen in the prior art. For example, when an analysis of the selected ion beam 115 is desired, a Faraday cup 134 operable to measure one or more properties of the ion beam may be selectively translated through the ion beam (as indicated by arrow 136) when the ion beam is at the minimal power. Thus, edges 138 of the Faraday cup 134 are subjected to minimal beam power, thus reducing chances for contaminants to flake off the edges of the Faraday cup (a common problem in conventional implantation systems). When desired, the ion beam 110 can be almost instantaneously brought to full power, where measurements can be taken via the Faraday cup 134. The Faraday cup 134 may be further coupled to the controller 132 in order to track and monitor beam current density for use in setting commands to the ion source 108.

In another example, a Faraday 140 can be positioned downstream of the workpiece 124, wherein the Faraday is operable to provide a signal 142 (e.g., an ion beam control signal) indicating whether the workpiece is present in the end station 126, as will be discussed hereafter. Alternatively, a workpiece handling system 144 (e.g., a robotic transfer system), the Faraday cup 134, or other hardware and/or software associated with the ion implantation system 100 can provide the signal 142 indicating the position of the workpiece within the ion implantation system, and all such signaling means are contemplated as falling within the scope of the present invention.

Figure 2:
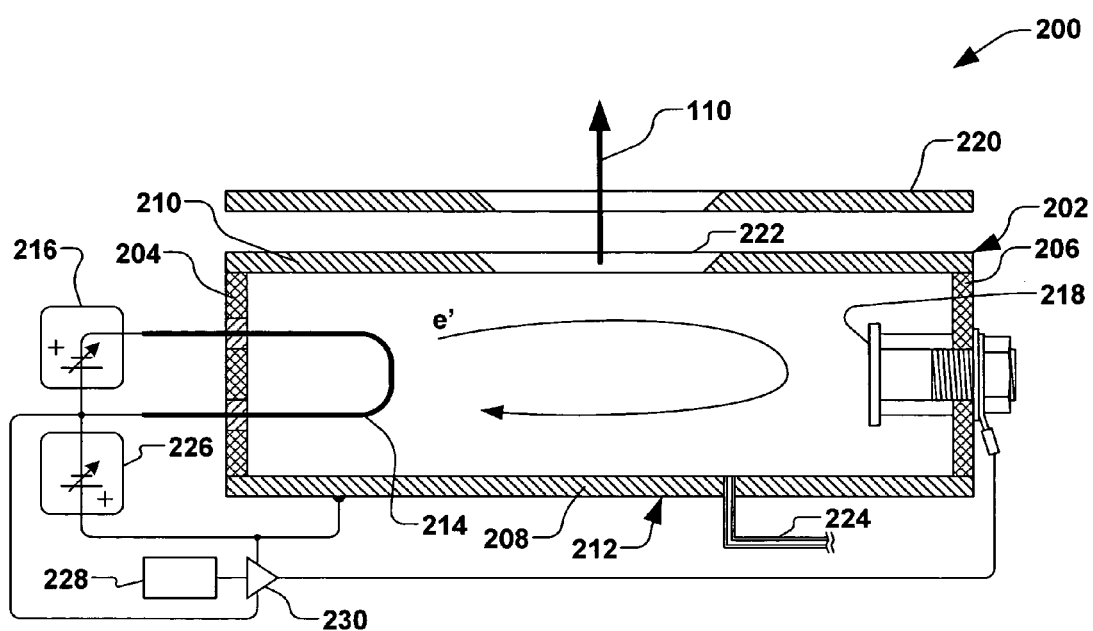
FIG. 2 is a partial cross-sectional view of an exemplary ion source according to one aspect of the present invention.

Referring now to FIG. 2, an exemplary ion source 200, such as the ion source 108 of FIG. 1, is illustrated in greater detail in accordance with another aspect of the present invention. The ion source 200 of FIG. 2 generally permits fast control of the number of electrons available for ionization thereof, therein providing the rapid response of the ion beam 110 described above. The ion source 200, for example, comprises an ion chamber 202 having first and second mutually opposed sides 204 and 206, and first and second mutually opposed walls 208 and 210, wherein the first and second sides and wall collectively define the ion chamber 202, thus further defining an anode 212 of the ion source 200, as described in U.S. Patent Publication 2002/0053642, the contents of which is incorporated herein by reference. A filament cathode 214 (also called a filament), for example, extends through the first side 204 and is coupled to a filament power supply 216, and a mirror electrode 218 is disposed in the second side 206. Furthermore, an extraction electrode assembly 220, for example, is operable to extract the ion beam 110 through an exit slit 222 defined in the second wall 210 of ion chamber 202. The extracted ion beam 110 (and associated arc current and ion plasma) is then generated in the conventional manner for a Bernas ion chamber. In another example, the ion chamber 202 may further comprise an ion precursor gas feed 224. It should be noted that the filament cathode 214 (e.g., a directly heated cathode) may be substituted with an indirectly heated cathode, as will be understood by one of ordinary skill in the art.

In accordance with one aspect of the invention, an arc power supply 226 is electrically coupled to the filament cathode 214 and the first and second ion chamber walls 208 and 210. A mirror programming circuit 228 is electrically coupled to the filament power supply 216, arc power supply 226, and mirror electrode 218, wherein the mirror programming circuit is operable to control the electrical potential on the mirror electrode relative to the filament cathode 214. Specifically, the mirror programming circuit 228 is operable to control the number of electrons trapped between the filament 214 and mirror electrode 218, and thus control the rate of ionization of the gas and the resulting current of the ion beam 110. The mirror programming circuit 228, for example, drives the voltage potential on electrode mirror 218 to approach the voltage potential of either the filament 214 (as in the case where an intensity of the ion beam 110 is to be increased), or the first and second walls 208 and 210 (as in the case were the intensity of the ion beam is to be decreased). When an error signal 230 potential approaches that of filament 214, the number of electrons available for ionization is increased, since the potential imposed on the electrode mirror 218 generally repels electrons back toward the center of the ion chamber 202. When the error signal 230 potential approaches that of the walls 208 and 210, and thus the error signal potential is positive relative to the filament 214, and electrons are attracted to and absorbed by the electrode mirror 218. Accordingly, the number of electrons available for ionization is reduced, and, in turn, the rate of ionization of the gas is likewise reduced, thus resulting in the desired reduction in intensity of the ion beam 110.

A reduction in current of the ion beam 110 can be achieved by driving the voltage potential of the electrode mirror 218 toward the potential of the chamber walls 208 and 210. Specifically, the beam current, and thus beam intensity, can be reduced by driving the mirror electrode voltage potential from that imposed on the filament to that imposed on the chamber wall. When making adjustments to the beam current, the difference in ion chamber system response time between prior art systems and the present invention is significant. The heating and cooling of the filament in the prior art has typically about a 0.5 second time constant because of the heat capacity of the filament. By contrast, the electron transit time across the arc chamber is measured in microseconds, so response times below 10 to 20 microseconds can be expected from the control of the electronic flux by the system.

Figure 3:
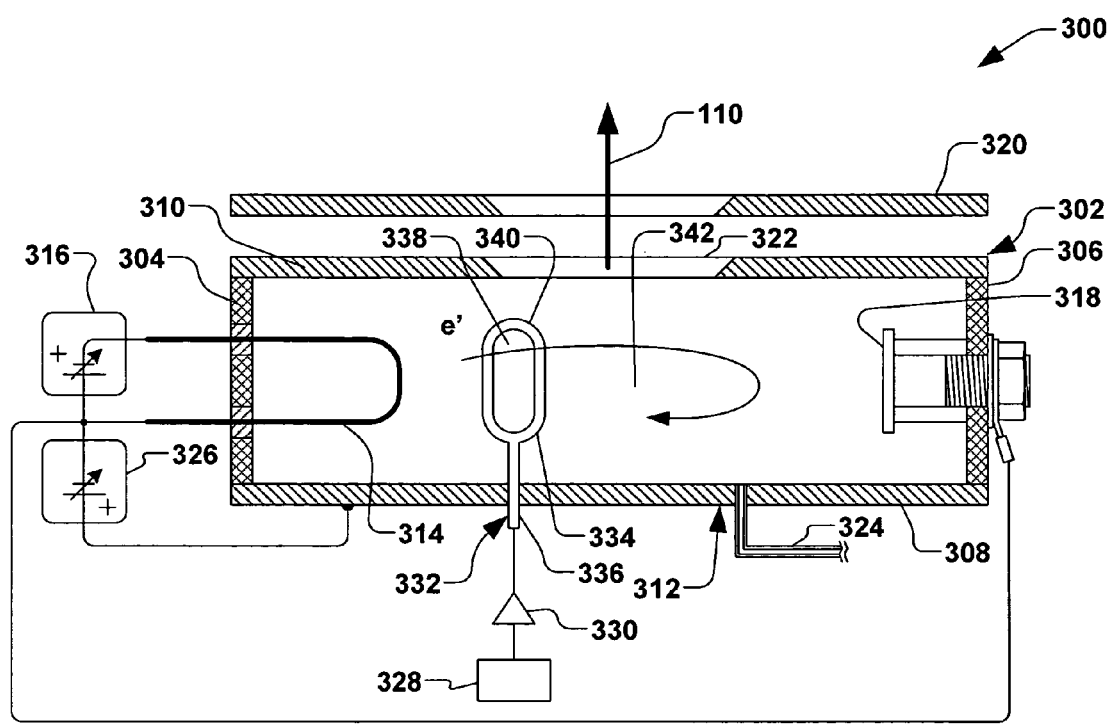
FIG. 3 is a partial cross-sectional view of another exemplary ion source according to another aspect of the present invention.

FIG. 3 illustrates another exemplary ion source 300 in accordance with the present invention. The ion source 300 comprises a source chamber 302 having first and second sides 304 and 306 and walls 308 and 310, wherein the first and second sides and walls generally define the ion source chamber, thus further defining an anode 312 of the ion source 300. Similar to the ion source 200 of FIG. 2, the ion source chamber 302 of FIG. 3 comprises a filament 314 (acting as the cathode) that extends through the first side 304, a filament power supply 316 coupled to the filament 314, a gas feed 324, and a mirror electrode 318 disposed within the first side 306. The resulting ion beam 110 passes through an exit slit 322 disposed in the second wall 310. The ion source 300, however, further comprises a grid electrode 332 having an round-shaped grid portion 334 and an outwardly extending support leg 336, as illustrated in FIG. 3. The grid portion 334 generally defines an aperture 338 defined by a loop portion 340, wherein the aperture is generally positioned between the filament 314 and the remainder of the ion chamber 302. The support leg 336, for example, generally passes through and is secured to the first wall 308 so that the grid electrode 332 can be positioned within ion source chamber 202 with the grid portion 334 positioned in relative proximity to the filament 314. The grid electrode 332, for example, is configured to operate like a grid in a conventional vacuum tube, and thus it will be understood that more than one grid may be employed in the ion source 300 without departing from the scope of the present invention.

In accordance with the present invention, an arc power supply 326 is electrically coupled to the filament 314 (cathode), the first and second walls 308 and 310 (anode), a filament power supply 316, and an electrode mirror 318. The arc power supply 326, for example, is further operable to negatively or positively drive the grid electrode 332 relative to the filament 314. Specifically, a grid programming circuit 328 is electrically coupled to the grid electrode 332 and receives a signal 330 which is chosen to produce the desired intensity of the ion beam 110. The grid programming circuit 328, for example, is operable to negatively bias the grid electrode 332 relative to the filament 314 in response to the signal 330 in order to retard electrons emitted from the filament so that the number of electrons flowing into a center region 342 of the ion source chamber 302 are reduced, thereby reducing the rate of ionization. Alternatively, the grid electrode 332 can be driven to or near the potential of the filament 314 in order to allow electrons to flow from the filament to the electrode mirror 318, in a similar manner as described with reference to FIG. 2. It is further possible to direct the potential of grid electrode 332 to be positive relative to the filament 314 in order to absorb electrons in a similar manner as the mirror electrode is operated as indicated with reference to FIG. 2.

Thus, the ion source 300 of FIG. 3 provides an extended range of control over that associated with the ion source 200 shown in FIG. 2. Specifically, the grid electrode 332 of FIG. 3 generally enables the ion source 300 to throttle the production of ions down to nearly zero. Accordingly, electron currents which are otherwise limited by space charge are inherently less noisy than those which are temperature limited, so the resultant ion beam 110 will be correspondingly less noisy. The present invention therefore provides a control system for rapidly controlling the output of the ion source for use in ion implantation. Superior stability and rapid control is provided, wherein electron flux within the ion chamber is electrically controlled, rather than by relying on thermal control of the ion chamber filament or changes in arc voltage.

Therefore, referring again to FIG. 1, in accordance with the present invention, in order to reduce contamination within the ion implantation system 100 at various times, such as during an exchange of workpieces 124, the current or power (e.g., intensity) of the ion beam 110 is selectively dimmed or ramped down by controlling the ion source 108 (e.g., the ion source 200 or 300 of FIG. 2 or 3) via the controller 132 of FIG. 1. For example, based on a position of the workpiece 124 within the ion implantation system 100 (e.g., a presence or absence of the workpiece within the end station 126), the ion beam 110 can be rapidly ramped up or down For example, during an insertion or removal of the workpiece 124 into or out of the ion implantation system 100, or at any other time at which it is not desirable for the ion beam 110 to be maintained at the implantation current, the current of the ion beam can be controlled to selectively ramp down to almost zero current output (e.g., the minimal power or current of between 0% and 10% of the implantation power or current), wherein formation of contamination within the ion implantation system 100 is advantageously decreased. Such a decrease in current of the ion beam 110 by controlling the ion source 108 as described above can advantageously reduce contamination in ways not seen in the prior art, since the ion beam was conventionally kept at the implantation power, regardless of workpiece placement.

Figure 4:
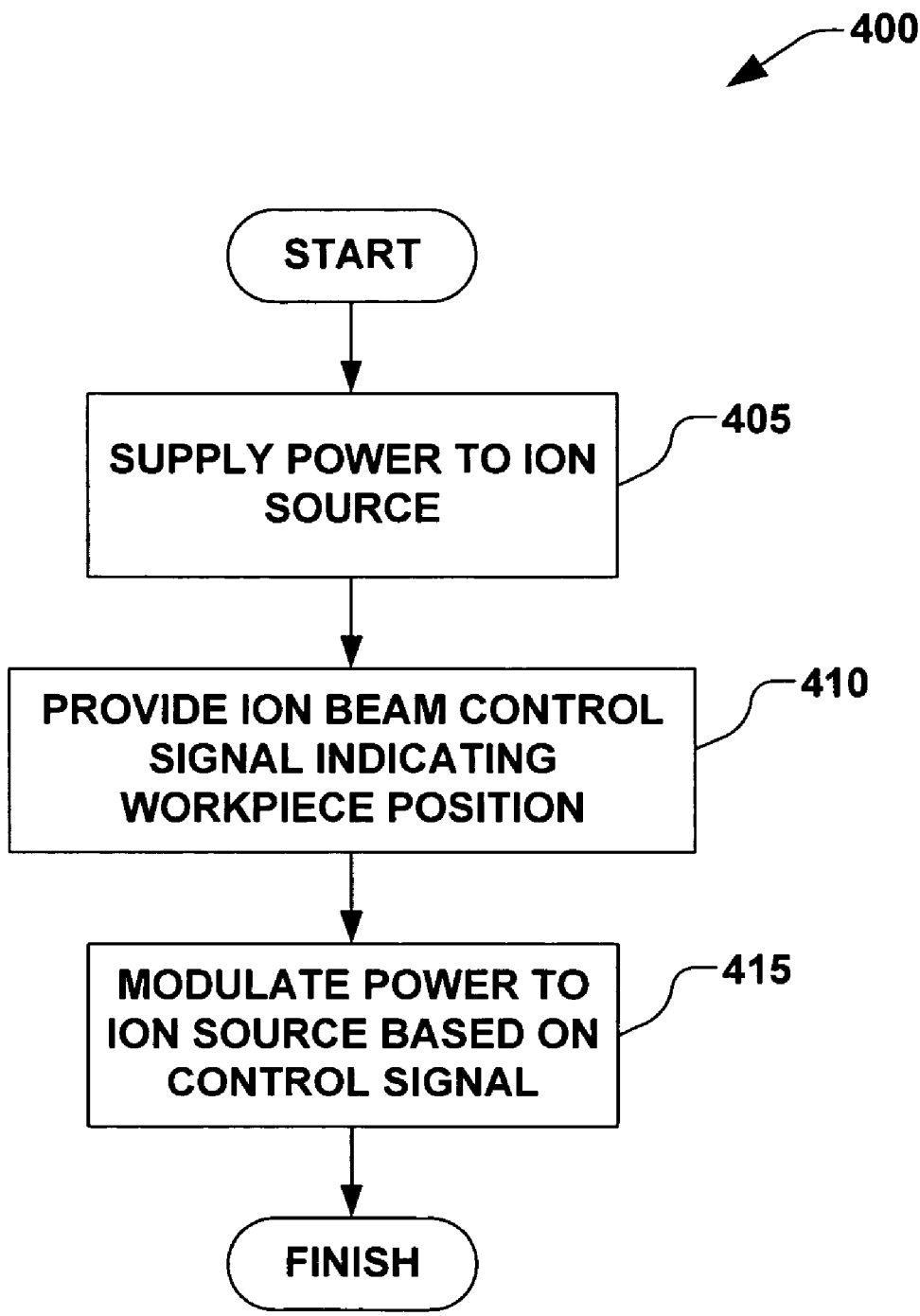
FIG. 4 is a block diagram of a method for mitigating contamination of a workpiece according to another exemplary aspect of the invention.

According to still another exemplary aspect of the present invention, FIG. 4 is a schematic block diagram of an exemplary method 400 illustrating an intermittent duty cycle for ion beam blanking, also called a method for particle control. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 4, the method 400 begins with supplying power to an ion source in act 405, therein forming an ion beam. For example, act 405 may comprise providing a power or current to one or more of a filament cathode 314, mirror electrode 318, and grid electrode 332 illustrated in FIG. 3. In act 410, an ion beam control signal is provided. The ion beam control signal, for example, may comprise the signal 142 of FIG. 1 from the workpiece handling system 144, or other signaling device, wherein a position of the workpiece within the ion implantation system 100 is provided to the controller 132. Alternatively, the ion beam control signal can be any signal, such as an operator input, wherein the signal indicates a condition at which implantation power of the ion beam is desired.

In act 415 of FIG. 4, the power or current to the ion source is controlled, based, at least in part, on the ion beam control signal. The control generally modulates the current or power of the ion beam between the implantation current and the minimal current in less than approximately 20 microseconds (e.g., the ion beam current is modulated from the minimal current of between 0% and 10% of the implantation current to the implantation current), based on the control signal. For example, an ion implantation is performed at the implantation power of the ion beam, and once an implantation of ions into a workpiece is complete (e.g., an ion beam control signal provided indicating a complete implantation), the current supplied to the mirror electrode 218 of FIG. 2 is controlled in act 415, wherein the current of the ion beam 110 is selectively modulated from the implantation current to the minimal current (e.g., almost 0% power). Once the ion beam is at the minimal current, the workpiece 124, for example, can be removed from the end station 126, while very little contamination is produced during the removal of the workpiece. Likewise, a new workpiece may be inserted into the end station while the ion beam is at the minimal current, wherein a control signal indicates that the workpiece is in position again in act 410. Upon receiving the control signal, the current supplied to the mirror electrode is again controlled to modulate the implantation current from the minimal current to implantation current again.

As an alternative, the grid 332 of FIG. 3 is controlled in act 415 of FIG. 4, as described above, wherein the current intensity of the ion beam 110 is rapidly modulated in a similar manner. The ion source can be further modulated to the implantation power, for example, once a workpiece is again placed in the end station. Therefore, the duty cycle of the ion source is significantly reduced, as compared to convention ion implantation system, and contamination within the ion implantation system is substantially mitigated.

Accordingly, the present invention generally mitigates particle contamination, and generally provides a level of particle control that is presently unseen in the ion implantation industry. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for controlling particle contamination in an ion implantation system, the method comprising the acts of:
   supplying power to an ion source, therein forming an ion beam at an implantation current, wherein contaminants are generally formed by the ion beam within the ion implantation system;
   providing an ion beam control signal; and
   controlling the power to the ion source based on the ion beam control signal, wherein a current of the ion beam is modulated between the implantation current and a minimal current in less than approximately 20 microseconds, wherein the formation of contaminants within the ion implantation system is substantially reduced at the minimal current of the ion beam.

2. The method of claim 1, wherein supplying power to the ion source comprises supplying current to a filament cathode and a mirror electrode of the ion source, therein forming an ion beam via an ionization of a precursor gas by electrons emitted from the filament cathode, and wherein controlling the power to the ion source comprises controlling the current supplied to the mirror electrode.

3. The method of claim 2, wherein controlling the current supplied to the mirror electrode comprises controlling a difference in electrical potential between the filament cathode and the mirror electrode, therein controlling the number of electrons available for ionization.

4. The method of claim 3, wherein the current of the ion beam is reduced from the implantation current to the minimal current by driving the potential of the mirror electrode positive relative to the filament cathode.

5. The method of claim 3, wherein the current of the ion beam is increased from the minimal current to the implantation current by driving the potential of the mirror electrode negative relative to the filament cathode.

6. The method of claim 1, wherein supplying power to the ion source comprises supplying current to a filament cathode, a mirror electrode, and at least one grid of the ion source, therein forming an ion beam via an ionization of a precursor gas by electrons emitted from the filament cathode, and wherein controlling the power to the ion source comprises controlling the current supplied to the at least one grid.

7. The method of claim 6, wherein controlling the current supplied to the at least one grid comprises controlling a difference in electrical potential between the filament cathode and the at least one grid, therein controlling the number of electrons available for ionization.

8. The method of claim 7, wherein the current of the ion beam is reduced from the implantation current to the minimal current by driving the potential of the at least one grid positive relative to the filament cathode.

9. The method of claim 7, wherein the current of the ion beam is increased from the minimal current to the implantation current by driving the potential of the at least one grid negative relative to the filament cathode.

10. The method of claim 1, wherein providing the ion beam control signal comprises determining a position of a workpiece within the ion implantation system.

11. The method of claim 10, wherein the ion beam control signal is provided by a workpiece handling system.

12. The method of claim 10, wherein the ion beam control signal is provided by a Faraday cup positioned along a path of the ion beam.

13. The method of claim 1, wherein the minimal current is between 0% and 10% of the implantation current.

14. A method for controlling particle contamination in an ion implantation system, the method comprising the acts of:
provided an ion source having a filament cathode and a mirror electrode;
determining a position of a workpiece within the ion implantation system;
supplying current to the filament cathode and mirror electrode of the ion source, therein forming an ion beam via an ionization of a precursor gas by electrons emitted from the filament cathode, wherein contaminants are generally formed within the ion implantation system when the ion beam is at an implantation current;
controlling the current supplied to the mirror electrode, therein rapidly modulating a current of the ion beam between the implantation current and a minimal current, wherein the control is based, at least in part, on the position of the workpiece, and wherein the formation of contaminants within the ion implantation system is substantially reduced when the ion beam is at the minimal current.

15. The method of claim 14, wherein determining the position of the workpiece comprises providing a signal from a workpiece handling system indicating that the workpiece is ready for ion implantation.

16. The method of claim 14, wherein determining the position of the workpiece comprises analyzing a signal provided by a Faraday positioned downstream of the workpiece.

17. The method of claim 14, wherein the minimal current is between 0% and 10% of the implantation current.

18. The method of claim 14, wherein the current of the ion beam is modulated between the implantation current to the minimal current in less than approximately 20 microseconds.

19. The method of claim 14, wherein controlling the current supplied to the mirror electrode comprises controlling a difference in electrical potential between the filament cathode and the mirror electrode, therein controlling the number of electrons available for ionization, and wherein the current of the ion beam is reduced from the implantation current to the minimal current by driving the potential of the mirror electrode positive relative to the filament cathode.

20. The method of claim 14, wherein controlling the current supplied to the mirror electrode comprises controlling a difference in electrical potential between the filament cathode and the mirror electrode, therein controlling the number of electrons available for ionization, and wherein the current of the ion beam is increased from the minimal current to the implantation current by driving the potential of the mirror electrode negative relative to the filament cathode.

21. An ion implantation system for implanting ions into a workpiece, the ion implantation system comprising:
an ion source comprising a filament cathode and a mirror electrode and operable to form an ion beam;
a power supply for supplying power to the filament cathode and mirror electrode of the ion source;
an end station, wherein the workpiece generally resides in the end station during an ion implantation;
a workpiece handing system operable to provide an ion beam control signal indicating the presence or absence of the workpiece in the end station; and
a controller, wherein the controller is operable to control the power from the power supply to the ion source based on the ion beam control signal, and wherein a current of the ion beam is modulated between an implantation current and a minimal current in less than approximately 20 microseconds, wherein contaminants are generally formed by the ion beam at the implantation current, and wherein the formation of contaminants is generally reduced at the minimal current.

22. The ion implantation system of claim 21, wherein the ion source further comprises at least one grid, and wherein the power supply further supplies power to the at least one grid.

* * * * *